(12) United States Patent
Göötz et al.

(10) Patent No.: US 11,670,742 B2
(45) Date of Patent: Jun. 6, 2023

(54) OPTOELECTRONIC SEMICONDUCTOR CHIP, METHOD FOR PRODUCING AN OPTOELECTRONIC SEMICONDUCTOR CHIP AND HEADLIGHT COMPRISING AN OPTOELECTRONIC SEMICONDUCTOR CHIP

(71) Applicant: OSRAM Opto Semiconductors GmbH, Regensburg (DE)

(72) Inventors: Britta Göötz, Regensburg (DE); Alexander Linkov, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 749 days.

(21) Appl. No.: 16/327,691

(22) PCT Filed: Aug. 2, 2017

(86) PCT No.: PCT/EP2017/069534
§ 371 (c)(1),
(2) Date: Feb. 22, 2019

(87) PCT Pub. No.: WO2018/036769
PCT Pub. Date: Mar. 1, 2018

(65) Prior Publication Data
US 2019/0207066 A1    Jul. 4, 2019

(30) Foreign Application Priority Data

Aug. 22, 2016 (DE) .......................... 102016115533.0

(51) Int. Cl.
*H01L 33/50* (2010.01)
*H01L 27/15* (2006.01)
(Continued)

(52) U.S. Cl.
CPC ............ *H01L 33/504* (2013.01); *F21S 41/00* (2018.01); *H01L 25/0753* (2013.01);
(Continued)

(58) Field of Classification Search
CPC ........ B60Q 1/04; B60Q 1/2696; B60Q 3/745; B60Q 2400/20; H01L 33/50; H01L 27/15; F21S 41/00
See application file for complete search history.

(56) References Cited

U.S. PATENT DOCUMENTS 9,825,208 B2    11/2017 Otto et al.
2006/0087861 A1*    4/2006 Tessnow .............. G02B 6/0073
362/538
(Continued)

FOREIGN PATENT DOCUMENTS

DE    102014112551 A    3/2016
DE    102014112769 A1    3/2016
(Continued)

*Primary Examiner* — William J Carter
(74) *Attorney, Agent, or Firm* — Slater Matsil, LLP

(57) ABSTRACT

An optoelectronic semiconductor chip and a method for producing an optoelectronic semiconductor chip are disclosed. In an embodiment an optoelectronic semiconductor chip includes a semiconductor layer sequence having a plurality of pixels, the semiconductor layer sequence comprising an active layer configured to generate electromagnetic radiation of a first wavelength range and a plurality of conversion elements, wherein each conversion element is configured to convert the radiation of the first wavelength range into radiation of a second wavelength range, wherein each pixel has a radiation exit surface and a conversion element is arranged on each radiation exit surface, and wherein each conversion element has a greater thickness in a central region than in a peripheral region.

2 Claims, 2 Drawing Sheets

(51) Int. Cl.
   *F21S 41/00*     (2018.01)
   *H01L 25/075*    (2006.01)
   *H01L 25/16*     (2023.01)
   *H01L 33/56*     (2010.01)
   *H01L 33/58*     (2010.01)
   *H01L 33/08*     (2010.01)

(52) U.S. Cl.
   CPC .......... *H01L 25/167* (2013.01); *H01L 27/156* (2013.01); *H01L 33/505* (2013.01); *H01L 33/56* (2013.01); *H01L 33/08* (2013.01); *H01L 33/58* (2013.01); *H01L 2933/0041* (2013.01); *H01L 2933/0058* (2013.01)

(56) References Cited

U.S. PATENT DOCUMENTS

| | | | | |
|---|---|---|---|---|
| 2010/0081218 | A1* | 4/2010 | Hardin | H01L 33/508 |
| | | | | 438/7 |
| 2010/0315320 | A1* | 12/2010 | Yoshida | G02F 1/133617 |
| | | | | 345/83 |
| 2011/0031516 | A1* | 2/2011 | Basin | H01L 33/507 |
| | | | | 257/98 |
| 2014/0339495 | A1* | 11/2014 | Bibl | H01L 25/0753 |
| | | | | 257/13 |
| 2014/0367633 | A1 | 12/2014 | Bibl et al. | |
| 2017/0309794 | A1 | 10/2017 | von Malm | |

FOREIGN PATENT DOCUMENTS

| | | | |
|---|---|---|---|
| EP | 2296179 | A2 | 3/2011 |
| JP | 2003046134 | A | 2/2003 |

* cited by examiner

OPTOELECTRONIC SEMICONDUCTOR CHIP, METHOD FOR PRODUCING AN OPTOELECTRONIC SEMICONDUCTOR CHIP AND HEADLIGHT COMPRISING AN OPTOELECTRONIC SEMICONDUCTOR CHIP

This patent application is a national phase filing under section 371 of PCT/EP2017/069534, filed Aug. 2, 2017, which claims the priority of German patent application 102016115533.0, filed Aug. 22, 2016, each of which is incorporated herein by reference in its entirety.

TECHNICAL FIELD

An optoelectronic semiconductor chip, a method for producing an optoelectronic semiconductor chip and a headlight with an optoelectronic semiconductor chip are specified.

SUMMARY OF THE INVENTION

Embodiments provide a semiconductor chip having a plurality of pixels whose radiation is converted by a conversion element and is homogenized in terms of color impression as a function of spatial angle and/or location. Further embodiments provide a method for producing a semiconductor chip. In other embodiments a headlamp with a semiconductor chip is provided.

An optoelectronic semiconductor chip particularly preferably comprises a semiconductor layer sequence with an active layer suitable for generating electromagnetic radiation of a first wavelength range. The semiconductor layer sequence has been grown epitaxially in particular. As a rule, the semiconductor layer sequence comprises a semiconductor body which may have further layers which may not have been grown epitaxially or are formed from a material other than a semiconductor material.

Particularly preferably, the semiconductor layer sequence is based on a nitride compound semiconductor material or is formed from a nitride compound semiconductor material. Nitride compound semiconductor materials are compound semiconductor materials containing nitrogen, such as materials from the $In_xAl_yGa_{1-x-y}N$ system with $0 \leq x \leq 1$, $0 \leq y \leq 1$ and $x+y \leq 1$.

Preferably the active layer generates blue light. It is also possible that the active layer generates ultraviolet light. For example, a semiconductor layer sequence based on a nitride compound semiconductor material is suitable for this purpose.

The semiconductor layer sequence preferably comprises a plurality of pixels, which are preferably arranged laterally next to each other. In other words, it is preferred in this case that the plurality of pixels are enclosed by a common semiconductor chip and not by separate semiconductor chips placed side by side.

A peripheral length of the pixels is preferably between 1 micrometer and 200 micrometers, inclusive.

For example, the pixels have a common active layer that extends laterally in a continuous manner through all pixels along a main surface of the semiconductor layer sequence. However, the active layer only generates electromagnetic radiation of the first wavelength range in the areas of the pixels if the current is applied appropriately, such that directly adjacent pixels are separated from each other by optically inactive areas that do not generate any radiation. It is also conceivable that directly adjacent pixels are separated from each other by trenches.

Furthermore, it is also possible that the pixels have different active layers that emit electromagnetic radiation of different first wavelength ranges. For example, it is possible that the active layers of the pixels emit electromagnetic radiation of different first wavelength ranges from the infrared spectral range. Furthermore, it is also possible that the active layers of the pixels emit visible light of different colors.

A layer sequence with an active layer that is suitable for emitting electromagnetic radiation from the infrared spectral range is based, for example, on an arsenide compound semiconductor material. Arsenide compound semiconductor materials are compound semiconductor materials containing arsenic, such as materials from the $In_xAl_yGa_{1-x-y}As$ system with $0 \leq x \leq 1$, $0 \leq y \leq 1$ and $x+y \leq 1$.

The optoelectronic semiconductor chip particularly preferably comprises a plurality of conversion elements, wherein each conversion element is configured to at least partially convert radiation of the first wavelength range into radiation of a second wavelength range, wherein the second wavelength range is different from the first wavelength range. In other words, the conversion elements are wavelength converting.

The term "wavelength converting" refers in particular to the conversion of irradiated electromagnetic radiation of a certain wavelength range into electromagnetic radiation of another, preferably longer wavelength range. As a rule, a wavelength converting element absorbs electromagnetic radiation of an irradiated wavelength range, converts it into electromagnetic radiation of another wavelength range by electronic processes on the atomic and/or molecular level and emits the converted electromagnetic radiation again.

Each pixel preferably has a radiation exit surface from which radiation of the first wavelength range generated in the active layer is emitted. One conversion element is particularly preferred on each radiation exit surface. Preferably, the conversion element is in direct contact with the radiation exit surface of the pixel.

Preferably, the conversion element is configured to convert the electromagnetic radiation of the first wavelength range, which is emitted by the active layer of the pixel to which the conversion element is applied, into electromagnetic radiation of a second wavelength range.

According to one embodiment of the semiconductor chip, the conversion elements of a semiconductor chip are of similar design, especially with regard to their wavelength converting properties and/or their shape.

Furthermore, it is also possible that the conversion elements are designed differently, for example, with regard to their wavelength converting properties. Thus, it is conceivable that the active layers of all pixels are of the same type and all pixels emit electromagnetic radiation of the same first wavelength range, while the conversion elements convert the radiation of the first wavelength range into electromagnetic radiation of different second wavelength ranges. Here, the pixels preferably emit mixed-colored light from different color locations, which is composed of radiation of the first wavelength range and radiation of the second wavelength range.

According to one embodiment of the semiconductor chip, a first group of pixels together with their conversion elements emit warm white light and a second group of pixels together with their conversion elements emit cold white light, and the pixels of the first group and the pixels of the second group are arranged in a checkerboard pattern.

Thus, it is conceivable that the active layers of the pixels emit blue light and a first group of the conversion elements convert part of the blue light such that the mixed-colored light of blue light and converted light is warm-white, while a second group of the conversion elements convert part of the blue light such that the mixed-colored light of blue light and converted light is cold-white. For example, the conversion elements of the first group and the conversion elements of the second group can be arranged in a checkerboard pattern.

Furthermore, it is also conceivable that the active layers of the pixels emit electromagnetic radiation of the same first wavelength range from the infrared spectral range, which is converted by the conversion elements into radiation of different second wavelength ranges.

Preferably, each conversion element has a greater thickness in a central region than in a peripheral region. Particularly preferred, each conversion element has a greater thickness in a central region of the radiation exit surface of a pixel than in a peripheral region of the radiation exit surface of a pixel.

According to one embodiment of the optoelectronic semiconductor chip, the conversion element has a shape which is rotationally symmetrical to an axis of the conversion element. The axis preferentially passes through a center of the radiation exit surface of the pixel and is perpendicular to the radiation exit surface of the pixel. Particularly preferably, the thickness of the conversion element along the axis is largest and decreases preferably continuously towards the peripheral regions. For example, the conversion elements are formed as a lens.

According to a further embodiment, the conversion element is composed of a plurality of wavelength converting single layers or comprises a plurality of wavelength converting single layers. Preferably, each wavelength converting single layer has a thickness between 1 micrometer and 20 micrometers, inclusive. The particularly preferred thickness of each wavelength converting single layer is between 1 micrometer and to micrometers, inclusive. For example, a wavelength converting single layer for the generation of cold white light has a thickness of approximately 5 micrometers. For example, a wavelength converting single layer for the generation of warm-white light has a thickness between 5 micrometers and 20 micrometers, inclusive.

For example, the conversion element is composed of wavelength converting single layers of the same thickness. Particularly preferably, the wavelength converting single layers of a conversion element are formed such as to be similar in terms of their wavelength converting properties.

According to one embodiment of the optoelectronic semiconductor chip, a cross-sectional area of the wavelength converting single layers continuously decreases from a first main surface of the conversion element to a second main surface of the conversion element. The wavelength converting single layers are preferably arranged in such a way that the centers of the wavelength converting single layers are arranged on a straight line parallel to a normal of the radiation exit surface. In this way, a conversion element can be obtained that has a greater thickness in a central region than in a peripheral region.

According to a further embodiment of the optoelectronic semiconductor chip, two conversion elements of directly adjacent pixels are continuously connected to each other by a thin layer of the wavelength converting material of the conversion elements. The thickness of the thin layer of the wavelength converting material connecting two directly adjacent pixels is preferably no greater than 5 micrometers.

In this embodiment of the semiconductor chip a continuous conversion layer is preferably formed that covers most of the main surface of the semiconductor chip over the entire surface. Here, the conversion layer comprises the conversion elements on the radiation exit surfaces and the thin layers connecting the conversion elements. The conversion layer can also be formed by the conversion elements on the radiation exit surfaces and the thin layers connecting the conversion elements.

According to a further embodiment of the optoelectronic semiconductor chip, the conversion element is formed from a resin in which phosphor particles are incorporated. The resin can be a silicone resin or an epoxy resin or a mixture of these two resins. The phosphor particles give the conversion element its wavelength converting properties.

For the phosphor particles, for example, one of the following materials is suitable: rare-earth-doped garnets, rare-earth-doped alkaline earth sulfides, rare-earth-doped thiogallates, rare-earth-doped aluminates, rare-earth-doped silicates, rare-earth-doped orthosilicates, rare-earths-doped chlorosilicates, rare-earth-doped alkaline earth silicon nitrides, rare-earth-doped oxynitrides, rare-earth-doped aluminum oxynitrides, rare-earth-doped silicon nitrides, rare-earth-doped sialons.

According to a preferred embodiment of the optoelectronic semiconductor chip, the active layer emits blue light during operation. It is also possible that the active layer emits ultraviolet light. Preferably, the conversion element converts the blue radiation of the active layer at least partially into yellow radiation. Furthermore, it is also possible that the conversion element at least partially converts the blue radiation into yellow and/or red and/or green radiation. If the active layer emits ultraviolet radiation, the conversion element converts the ultraviolet radiation particularly preferably into blue, green and/or red radiation. Here, the conversion of the ultraviolet radiation preferably takes place completely.

According to a particularly preferred embodiment of the optoelectronic semiconductor chip, which emits white light. The white light is preferably composed of converted radiation and unconverted radiation. For example, the white light is composed of converted yellow radiation and unconverted blue radiation.

One idea of the present application is to use a plurality of conversion elements for a pixelated radiation-emitting semiconductor chip, the thickness of which is increased in a central region compared to a peripheral region. In particular, the conversion elements shall be configured to convert radiation emitted from an edge region of the radiation exit surface of a pixel to a smaller part than radiation emitted from a central region of the radiation exit surface of a pixel. This compensates two effects in the peripheral region of the radiation exit surface, such that the color impression of the radiation emitted by the semiconductor chip is homogenized as a function of location and/or angle. One effect is that there is less unconverted radiation, such as, for example, blue light, at the peripheral region of the radiation exit surface of a pixel due to the optically inactive areas between two directly adjacent pixels. The opposite effect is that less radiation is converted due to the smaller thickness of the conversion elements in the peripheral regions.

Furthermore, there is less light conduction between directly adjacent pixels, such that a yellow color impression at the peripheral region of the pixels is minimized, which can occur with a continuous conversion layer of homogeneous thickness, especially if the directly adjacent pixel is switched off. This usually also increases the contrast advantageously.

In a method for producing an optoelectronic semiconductor chip, for example, a semiconductor layer sequence with a plurality of pixels is provided. Each pixel has a radiation exit surface from which electromagnetic radiation, which is generated in an active layer of the semiconductor layer sequence, is emitted during operation.

In a next step, a conversion element is applied to each radiation exit surface. The application of a plurality or all conversion elements to the radiation exit surfaces of a plurality or all pixels can be done simultaneously, for example, by a printing process. For example, the printing method can be selected from the following group: Ink jet process, aerosol jet process, electro-hydrodynamic ink jet process, screen printing process.

According to an embodiment of the method, the conversion elements are produced by applying a plurality of wavelength converting single layers on top of each other. For example, the conversion elements are generated by printing a plurality of wavelength converting single layers on top of each other. The wavelength converting single layers are particularly preferably in direct contact with each other in this embodiment of the method. According to one embodiment of the method, each wavelength converting single layer is partially or completely cured after application. It is only after the wavelength converting single layer has been cured that the next wavelength converting single layer is applied.

The single layers can, for example, be thermally or optically cured. Electromagnetic radiation, such as UV radiation or IR radiation, can be used for curing. Curing can also be carried out in an oven.

The optoelectronic semiconductor chip is particularly suitable for use in a headlight. The optoelectronic semiconductor chip preferably is the light source in the headlight. Due to its pixels, it is usually advantageously suited to realize special functions of the headlamp, such as cornering light.

Particularly preferably, a semiconductor chip used in a headlight has pixels with identically formed active layers, which are preferably covered with similar conversion elements. Preferably, all pixels of the semiconductor chip together with the conversion elements emit white light, which is preferably also of the same type.

Features, elements and embodiments which are described here only in connection with the semiconductor chip may also be formed in the method and vice versa. Features, elements and embodiments which are described here only in connection with the semiconductor chip or method may also be formed in the headlamp and vice versa.

BRIEF DESCRIPTION OF THE DRAWINGS

Further advantageous embodiments and developments of the invention result from the exemplary embodiments described below in connection with the figures.

Identical, similar or identically acting elements are provided in the figures with the same reference numbers. The figures and the proportions of the elements shown in the figures with respect to each other are not to be regarded as true to scale. Rather, individual elements, in particular layer thicknesses, may be oversized for better representability and/or better understanding.

DETAILED DESCRIPTION OF ILLUSTRATIVE EMBODIMENTS

Figure 1:
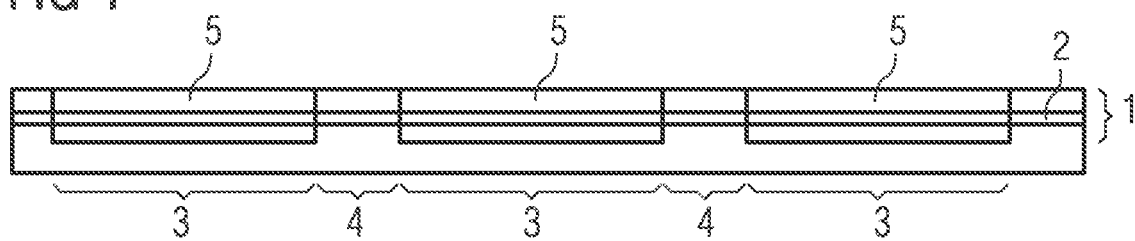
FIGS. 1 and 2 show a method according to an exemplary embodiment.
Figure 2:
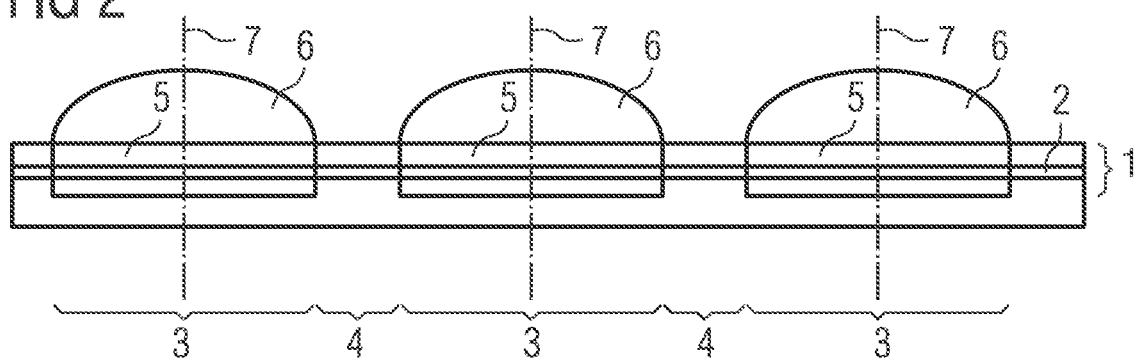

In the method according to the exemplary embodiment of FIGS. 1 to 2, a semiconductor layer sequence 1 with an active layer 2 suitable for generating electromagnetic radiation of a first wavelength range is first provided (FIG. 1). The semiconductor layer sequence 1 is based on a nitride compound semiconductor material and is suitable for emitting blue light. In other words, the first wavelength range is formed by blue light. However, it is also possible that the first wavelength range is formed by infrared light.

The semiconductor layer sequence 1 comprises a plurality of pixels 3 arranged laterally next to each other, wherein the active layer 2 extends through all pixels 3 in the present case. The pixels 3 are separated from each other by optically inactive areas 4 of the semiconductor layer sequence 1, which also comprise part of the active layer 2. However, the optically inactive areas 4 do not emit electromagnetic radiation during operation of the semiconductor chip as they are not energized. Each pixel 3 has a radiation exit surface 5 from which electromagnetic radiation of the first wavelength range is emitted during operation of the semiconductor chip. In the present exemplary embodiment, all active layers 2 of the pixels 3 are of the same design and, in particular, all generate electromagnetic radiation of the same first wavelength range. However, it is also possible that the active layers 2 of the pixels 3 are formed differently such that they emit electromagnetic radiation of different second wavelength ranges.

In a next step, schematically shown in FIG. 2, a conversion element 6 is applied to the radiation exit surface 5 of each pixel 3, for example, by printing. The conversion elements are made of silicone in which phosphor particles are incorporated. Each conversion element 6 is suitable for converting radiation of the first wavelength range into radiation of a second wavelength range. In the present case, each conversion element 6 partially converts the blue light of the active layer 2 into yellow light, such that the optoelectronic semiconductor chip emits mixed-colored white light composed of yellow converted light and blue unconverted light.

In the present case, each conversion element 6 has a greater thickness in a central region of the conversion element 6 than in a peripheral region of the conversion element 6. In the present case, the conversion elements 6 are arranged on the radiation exit surfaces 5 in such a way that they have a greater thickness in a central region of the radiation exit surface 5 than in a peripheral region of the radiation exit surface 5. In the present case, the conversion elements 6 are all similar in shape and wavelength converting properties.

Furthermore, it is also conceivable that the conversion elements 6 have different wavelength converting properties and convert electromagnetic radiation of a first wavelength range, which is emitted by the active layer 2 of the respective pixel 3 to which the respective conversion element 6 is applied, into radiation of different second wavelength ranges.

In particular, the conversion elements 6 are lenticular and rotationally symmetrical to an axis 7. The axis 7 passes through a center of the radiation exit surface 5 of the pixel 3 and is perpendicular to the radiation exit surface 5 of the pixel 3.

Figure 3:
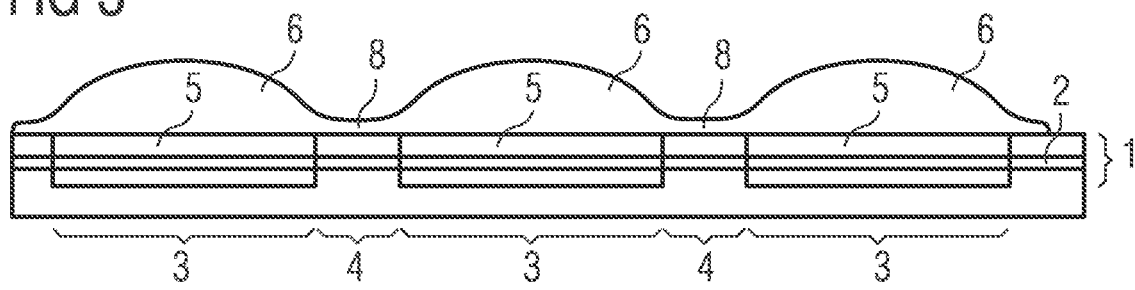
FIG. 3 shows an optoelectronic semiconductor chip according to an exemplary embodiment.

In contrast to the optoelectronic semiconductor chip shown in FIG. 2, the optoelectronic semiconductor chip shown in the exemplary embodiment of FIG. 3 has interconnected conversion elements 6. The conversion elements 6 on the radiation exit surface 5 of the pixels 3 are connected by thin layers 8 of the wavelength converting material of the conversion elements 6. Conversion elements 6, as shown in FIG. 3, which are laterally interconnected by thin layers of wavelength converting material, can be generated, for example, by printing.

Figure 4:
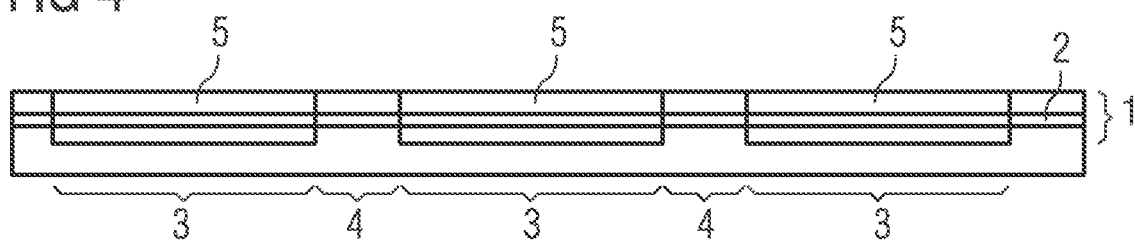
FIGS. 4 to 6 show further exemplary embodiments of the method.
Figure 5:
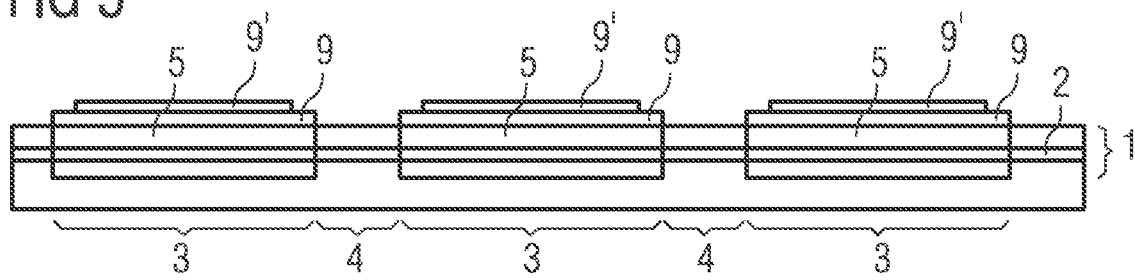
Figure 6:
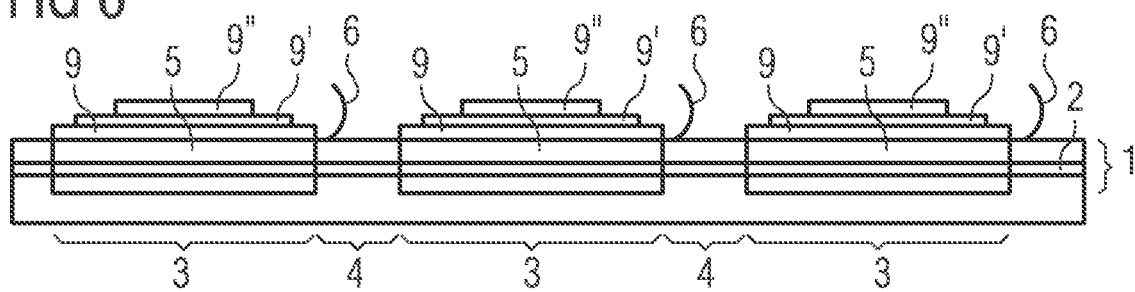

In the method according to the exemplary embodiment of FIGS. 4 to 6, a semiconductor layer sequence 1 is first provided, as already described in FIG. 1 (FIG. 4). Then a wavelength converting single layer 9 is applied to the radiation exit surface 5 of each pixel 3, for example, by printing. In the next step, which is not shown here, the wavelength converting single layer 9 is cured.

Then a further wavelength converting single layer 9' is applied in direct contact to the already applied and cured wavelength converting single layer 9, which has a smaller cross-sectional area than the already applied single layer 9 (FIG. 5). The other wavelength converting single layer 9' is also cured.

Then, as schematically shown in FIG. 6, a further wavelength converting single layer 9", which in turn has a reduced cross-sectional area compared with the two wavelength converting single layers 9, 9' already applied, is deposited onto the last wavelength converting single layer 9' applied and cured. The cross-sectional areas of the wavelength converting single layers continuously decrease from a first main area of the conversion element 6 to a second main area of the conversion element 6. In this way, a conversion element 6 can be constructed which has a greater thickness in a central region above the radiation exit surface 5 of each pixel 3 than in peripheral regions of the radiation exit surface of the pixel 3.

The invention is not limited by the description with reference to the exemplary embodiments. Rather, the invention includes each new feature as well as each combination of features, which in particular includes each combination of features in the patent claims, even if that feature or combination itself is not explicitly mentioned in the patent claims or exemplary embodiments.

The invention claimed is:

1. An optoelectronic semiconductor chip comprising:
   a semiconductor layer sequence having a plurality of pixels, the semiconductor layer sequence comprising an active layer configured to generate electromagnetic radiation of a first wavelength range; and
   a plurality of conversion elements,
   wherein each conversion element is configured to convert the radiation of the first wavelength range into radiation of a second wavelength range,
   wherein each pixel has a radiation exit surface,
   wherein a conversion element is arranged on each radiation exit surface,
   wherein each conversion element has a greater thickness in a central region than in a peripheral region,
   wherein a first group of pixels together with their respective conversion elements are configured to emit warm white light and a second group of pixels together with their respective conversion elements are configured to emit cold white light, and
   wherein the pixels of the first group and the pixels of the second group are arranged in a checkerboard pattern.

2. The optoelectronic semiconductor chip according to claim 1, wherein each conversion element has a shape which is rotationally symmetrical to an axis of the conversion element.

* * * * *